United States Patent
Kusunoki et al.

(10) Patent No.: US 7,307,473 B2
(45) Date of Patent: Dec. 11, 2007

(54) DISTORTION COMPENSATING AND POWER AMPLIFYING APPARATUS

(75) Inventors: Shigeo Kusunoki, Kanagawa (JP); Tadanaga Hatsugai, Tokyo (JP)

(73) Assignee: Sony Ericsson Mobile Communications Japan, Inc., Tokyo (JP)

( * ) Notice: Subject to any disclaimer, the term of this patent is extended or adjusted under 35 U.S.C. 154(b) by 123 days.

(21) Appl. No.: 11/108,666

(22) Filed: Apr. 19, 2005

(65) Prior Publication Data
US 2005/0242877 A1   Nov. 3, 2005

(30) Foreign Application Priority Data
Apr. 30, 2004   (JP) ............................... 2004-135363

(51) Int. Cl.
*H03F 1/26* (2006.01)
(52) U.S. Cl. ........................ 330/149; 330/302
(58) Field of Classification Search ............. None
See application file for complete search history.

(56) References Cited

U.S. PATENT DOCUMENTS 3,825,843 A * 7/1974 Felsberg et al. ............ 330/149

FOREIGN PATENT DOCUMENTS

| JP | 8-14894 | 6/1996 |
| JP | 10-65465 | 3/1998 |
| JP | 2004-32351 | 1/2004 |

OTHER PUBLICATIONS

"Harmonic Feedback Circuit Effects on Intermodulation Products and Adjacent Channel Leakage Power in HBT Power Amplifier for 1.95 HGz Wide-Band CDMA Cellular Phones," K. Joshin, et al., IEICE Trans. Electron., vol. E82-C, No. 5, May 1999, pp. 725-729.
"New Linearization Method Using Interstage Second Harmonic Enhancement," D. Jing, et al., IEEE Microwave and Guided Wave Letters, vol. 8, No. 11, Nov. 1998, pp. 402-404.
"A Low Third Order Intermodulation Amplifier with Harmonic Feedback Circuitry," M. R. Moazzam, et al., IEEE MTT-S Digest, 1996, pp. 827-830.
"An Analysis of Higher-Order of a GaAs FET Depending on IMD Source Impedance and its Application to a Design of Low-Distortion MMIC Power Amplifiers," S. Kusunoki, et al., Electronics and Communications in Japan, Part 2, vol. 85, No. 4, 2002, Translated from Denshi Joho Tsushin Gakkai Ronbunshi, vol. J83-C, No. 6, Jun. 2000, pp. 542-552.
"Low Intermodulation Amplifiers for RF and microwave Wireless Systems," N. Males-Ilic, et al., Proceedings of APMC 2001, Taipei, Taiwan, R.O.C., pp. 984-987.

* cited by examiner

*Primary Examiner*—Khanh Van Nguyen
(74) *Attorney, Agent, or Firm*—Oblon, Spivak, McClelland, Maier & Neustadt, P.C.

(57) ABSTRACT

Disclosed is a distortion compensating and power amplifying apparatus including: a transistor to power amplifies an input signal; a branch circuit to branch the input signal into two signals; distortion compensation means for generating a second harmonic of a fundamental wave for one of branched signals and adding the generated second harmonic to the other branch signal from said branch circuit for input to an input terminal of said transistor; and a termination circuit connected to an output terminal of said transistor and grounding the second harmonic.

13 Claims, 13 Drawing Sheets

DISTORTION COMPENSATING AND POWER AMPLIFYING APPARATUS

CROSS REFERENCES TO RELATED APPLICATIONS

The present invention contains subject matter related to Japanese Patent Application JP 2004-135363 filed in the Japanese Patent Office on Apr. 30, 2004, the entire contents of which being incorporated herein by reference.

BACKGROUND OF THE INVENTION

1. Field of the Invention

The present invention relates to a distortion compensating apparatus and particularly to a distortion compensating apparatus applicable to high-frequency power amplifiers for cellular phones.

2. Description of Related Art

In the past, a cellular phone using the CDMA (Code Division Multiple Access) system always varies terminal's transmission power. The output distribution often peaks approximately 10 mW when the speech communication is used. In many cases, a CDMA cellular phone terminal uses a DC-DC converter to vary power supply voltages of a power amplifier (PA) at low and high outputs so that the efficiency for low outputs is improved. The longer the terminal operates in low-output mode, the less the terminal consumes electric currents. However, as the cellular phone terminal is equipped with many data processing capabilities, the transmission power distribution is shifting to the high output side.

It is expected to output high power as possible especially at low power supply voltages. This ensures low power consumption for the entire terminal. For this purpose, it is important to further increase a power changeover threshold value that switches between a low output and a high output. In low-output mode, the DC-DC converter is used to set a small power supply voltage (e.g., 1.5 V) to be applied to a power amplifier. It is preferable to maximally increase the power output in this state and operate the terminal as long as possible in the low-output mode. This results in reducing the power consumption for the entire terminal.

However, increasing the power changeover threshold value also increases distortion. It is important to decrease distortion also during low output. Distortion compensation technologies are long proposed, but cannot be directly applied to cellular phone terminals in consideration for increase in the circuit scale.

In recent years, there are proposed technologies to improve the distortion by injecting a second harmonic (non-patent documents 1 through 4). FIG. 13 shows a typical constitution. In FIG. 13, a branch circuit (div) 50 branches an input signal into two outputs. One output is input to the gate of a small source-grounded FET (Field Effect Transistor) 51. The FET 51 generates a second harmonic that is then extracted in a band pass filter (BPF) 52. The second harmonic's phase and amplitude is adjusted in a phase circuit (Ph) 53 and an attenuation circuit (ATT) 54, respectively. The second harmonic is then input to a first input terminal of an addition circuit (add) 55. On the other hand, the other output from the branch circuit 50 is input to a second input terminal of the addition circuit 55. The added output is input to an input terminal of a power amplifier (A) 56. Distortion generated from the power amplifier 56 is decreased in such a manner that the phase circuit 53 and the attenuation circuit 54 optimally adjust the phase and the amplitude generated in the FET 51.

[Patent Document 1]
JP-A No. 65465/1998
[Patent Document 2]
JP-A No. 148949/1996
[Non-Patent Document 1]
K. Joshin, Y. Nakasha, T. Iwai, T. Miyashita, S. Ohara, "Harmonic Feedback Circuit Effects on Intermodulation Products and Adjacent Channel Leakage Power in HBT Power Amplifier for 1.9 GHz Wide-Band CDMA Cellular Phones," IEICE Trans. Electron., vol. E82-C, no. 5, May 1999, pp. 725-729.
[Non-Patent Document 2]
M. R. Moazzam, C. S. Aitchison, "A Low Order Intermodulation Amplifier with Harmonic Feedback Circuitry," IEEE MTT-S Digest, 1996, WE3F-5.
[Non-Patent Document 3]
D. Jing, W. Chan, S. M. Li, C. W. Li, "New Linearization Method Using Interstage Second Harmonic Enhancement," IEEE Microwave and Guide Wave Letters, vol. 8, No. 11, pp. 402-404, November 1998.
[Non-Patent Document 4]
N. Males-Ilic, B. Milovanovic, D. Budimir, "Low Intermodulation Amplifiers for RF and Microwave Wireless System," Asian Pacific Microwave Conference 2001, Proceedings, pp. 984-987.
[Non-Patent Document 5]
S. Kusunoki, T. Furuta and Y. Murakami, "An analysis of higher-order IMD depending on source impedance of a GaAs FET and its application to a design of low distortion MMIC power amplifiers," Electronics and Communications in Japan, vol. 85, No. 4, pp. 10-21, April 2002, John Wiley and Sons, Inc. NY. USA ("Analyzing dependency of high-order intermodulation distortion on gate-connected impedance and improving digital modulation distortion of a power amplifier," the Institute of Electronics, Information and Communication Engineers: Japanese article magazine vol. J83-C, No. 6, pp. 542-552, June 2000)

SUMMARY OF THE INVENTION

The following problem is intrinsic to the distortion compensation by means of harmonic injection as shown in FIG. 13. That is, the distortion compensation becomes ineffective for the power amplifier at given power. This phenomenon is described with reference to a graph in FIG. 6. FIG. 6 shows characteristics of the power amplifier's third-order intermodulation distortion (IM3). In comparison with no harmonic injection performed, the graph shows actual measurements indicative of effects when the harmonic injection is used for distortion compensation. A curve marked with "related example" in FIG. 6 corresponds to provision of the harmonic injection as described with reference to FIG. 13. The graph reveals that the third-order intermodulation distortion (IM3) suddenly rises around output Pout=10 dBm. In this case, any output greater than or equal to Pout=10 dBm does not decrease the third-order intermodulation distortion (IM3) whatever adjustment is made to the phase circuit (ph) 53 and the attenuation circuit (ATT) 54 in FIG. 13. That is, any output power greater than or equal to 10 dBm reduces the distortion compensation effect.

The present invention therefore addresses above issues by providing a distortion compensating and power amplifying apparatus capable of providing the excellent distortion compensation effect up to as high output power as possible when the second harmonic injection is used for distortion compensation.

In one embodiment of the present invention, a distortion compensating and power amplifying apparatus includes: a transistor to power amplifies an input signal; a branch circuit to branch the input signal into two signals; distortion compensation means for generating a second harmonic of a fundamental wave for one of branched signals and adding the generated second harmonic to the other branch signal from the branch circuit for input to an input terminal of the transistor; and a termination circuit connected to an output terminal of the transistor and grounding the second harmonic.

In the embodiment, when only the distortion compensation means is used, the distortion compensation effect decreases for high output power. Combining the distortion compensation means with the termination circuit improves the distortion compensation effect for higher output power.

In the embodiment, the termination circuit includes a coil and a capacitor connected parallel to each other, for example. Viewed from the transistor's output terminal, the combination of the coil and the capacitor takes effect so as to become almost open to a fundamental wave and almost short-circuited for a second harmonic.

In another embodiment of the present invention, the distortion compensation means includes: a source-grounded FET whose gate terminal receives one of the branched signals; a band pass filter which passes only a second harmonic connected to the FET's drain terminal; an attenuation circuit which is connected to the band pass filter's output and attenuates a second harmonic's signal voltage; a phase circuit which is connected to the attenuation circuit's output and adjusts the second harmonic's phase; and an addition circuit which adds the phase circuit's output to the other branch signal from the branch circuit. The band pass filter extracts a second harmonic generated from the source-grounded FET. The attenuation circuit and the phase circuit adjust the second harmonic's amplitude and phase. The addition circuit adds the second harmonic to one of the branch signals. This offsets distortion components generated in the transistor.

In another embodiment of the present invention, the distortion compensation means includes: a source-grounded FET whose gate terminal receives one of the branched signals; a matching circuit which is connected between the branch circuit and the source-grounded FET's gate terminal and has a specified impedance; a band pass filter which is connected to the source-grounded FET's drain terminal and passes only the input signal's second harmonic; an attenuation circuit which is connected to this band pass filter's output and attenuates a second harmonic's signal voltage; and an addition circuit which adds this attenuation circuit's output to the other branch signal from the branch circuit. In this case, the matching circuit's specified impedance affects phases of the second harmonic generated from the transistor and is configured so that a second harmonic input to the addition circuit compensates distortion generated in the power amplifier. The distortion compensation means adjusts the matching circuit's impedance to omit a phase circuit.

In the embodiment, a second distortion compensating and power amplifying apparatus according to the present invention includes: a matching circuit which receives input signals and is provided with a specified impedance; a first source-grounded FET whose gate terminal receives this matching circuit's output; a branch circuit which branches a signal output from the first source-grounded FET's drain terminal into two signals; a transistor to power amplifies an input signal; distortion compensation means for extracting a fundamental wave's second harmonic contained in one of branch signals, adding the second harmonic to the other branch signal from the branch circuit, and adding a result to the transistor's input terminal; and a termination circuit connected to an output terminal of the transistor and grounding the second harmonic. A second source-grounded FET can be used to constitute the transistor.

In the embodiment, the second distortion compensating and power amplifying apparatus constitutes a 2-stage amplifier including the first source-grounded FET and the transistor serially connected to each other. The first source-grounded FET has two functions, i.e., first-stage amplification and second harmonic generation. The other effects are the same as for the first distortion compensating and power amplifying apparatus.

The embodiments of the present invention combines the distortion compensation means for performing distortion compensation by means of second harmonic injection and the termination circuit that is connected to the transistor's output terminal and grounds the second harmonic. In this manner, the present invention solves the problem of decreasing the distortion compensation effect for high output voltages through the use of only the distortion compensation means. It is possible to make the distortion compensation effective for higher output voltages and realize a power amplifying apparatus with low distortion.

The embodiments of the present invention optimizes a phase of the second harmonic to be injected by adjusting an impedance of the matching circuit to be connected to the FET gate. In this manner, the amplifying apparatus can be miniaturized without needing for a large phase circuit as used for the prior art.

The embodiments of the present invention is suitably applied to portable terminals such as CDMA cellular phones that use a battery as the power source.

Other and further objects, features and advantages of the invention will appear more fully from the following description.

DETAILED DESCRIPTION OF THE PREFERRED EMBODIMENTS

Figure 1:
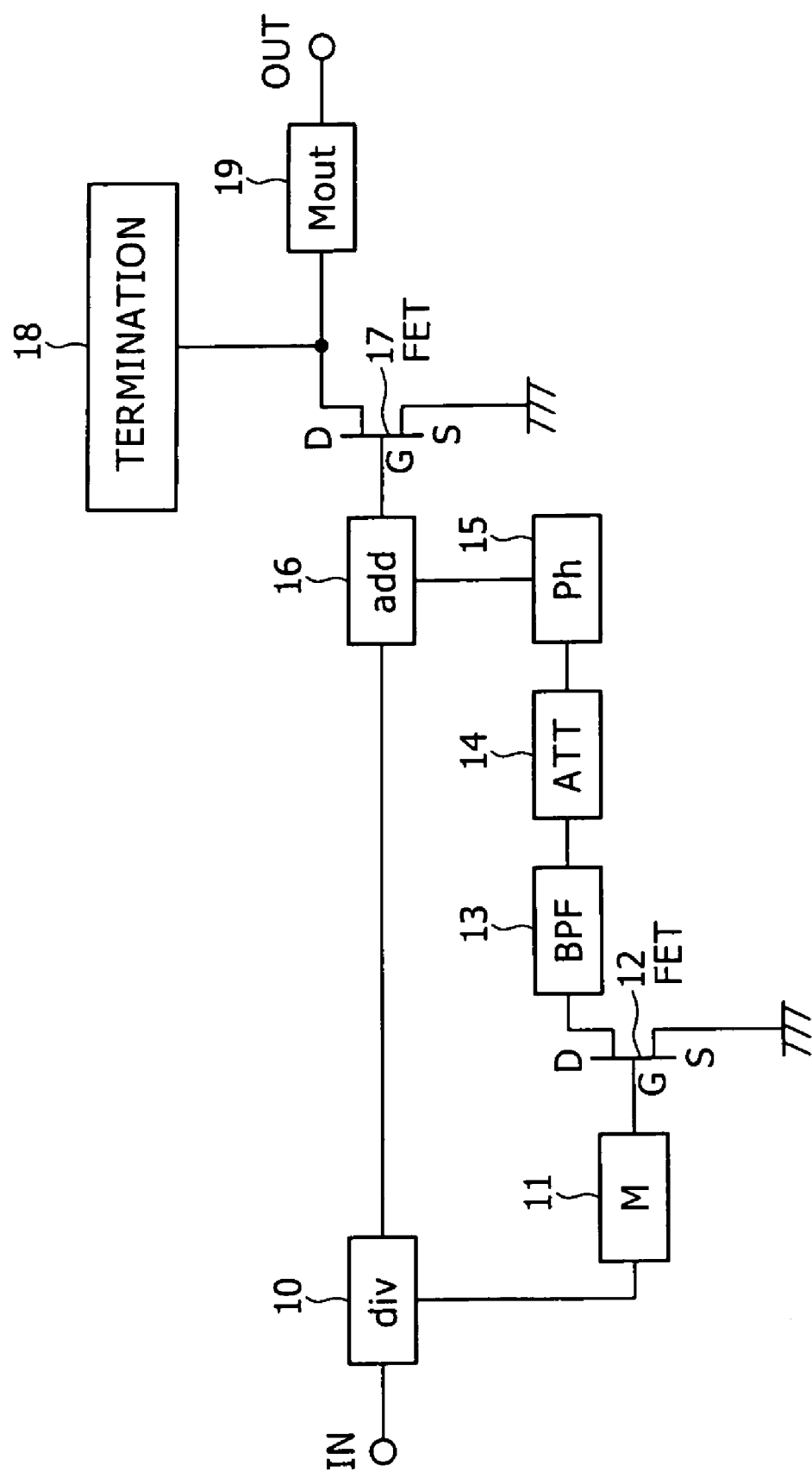
FIG. 1 is a block diagram showing the schematic construction of a distortion compensating and power amplifying apparatus according to an embodiment of the present invention.

Embodiments of the present invention will be described in further detail with reference to the accompanying drawings. FIG. 1 is a block diagram showing the schematic construction of a distortion compensating and power amplifying apparatus according to an embodiment of the present invention.

The distortion compensating and power amplifying apparatus in FIG. 1 includes a source-grounded FET 17 to amplify power and a source-grounded FET 12 to generate second harmonics. The distortion compensating and power amplifying apparatus further includes a branch circuit 10, a first matching circuit (M) 11, a band pass filter (BPF) 13, an attenuation circuit (ATT) 14, a phase circuit (Ph) 15, an addition circuit (add) 16, a termination circuit 18, and a second matching circuit (Mout) 19. The branch circuit 10 branches an input signal into two outputs. The first matching circuit (M) 11 is connected between a first output terminal of the branch circuit 10 and a gate terminal of the FET 12. The band pass filter (BPF) 13 is connected to a drain terminal of the FET 12 and passes only second harmonics. The attenuation circuit. (ATT) 14 is connected to output from the band pass filter 13 and attenuates signal voltages of second harmonics. The phase circuit (Ph) 15 is connected to output from the attenuation circuit 14 and adjusts second harmonic phases. The addition circuit (add) 16 connects its first input terminal to output from the phase circuit 15 and its second input terminal to a second output terminal of the branch circuit 10. The addition circuit (add) 16 adds input signals supplied to the first and second input terminals and generates an output from its output terminal to the gate terminal of the FET 17. The termination circuit 18 is connected to the drain terminal of the FET 17. The second matching circuit (Mout) 19 is also connected to the drain terminal of the FET 17. The output terminal of the second matching circuit 19 functions as an output terminal OUT of the amplifying apparatus. Basically, the termination circuit 18 constructs the second harmonic termination circuit 18 that grounds second harmonics.

Figure 13:
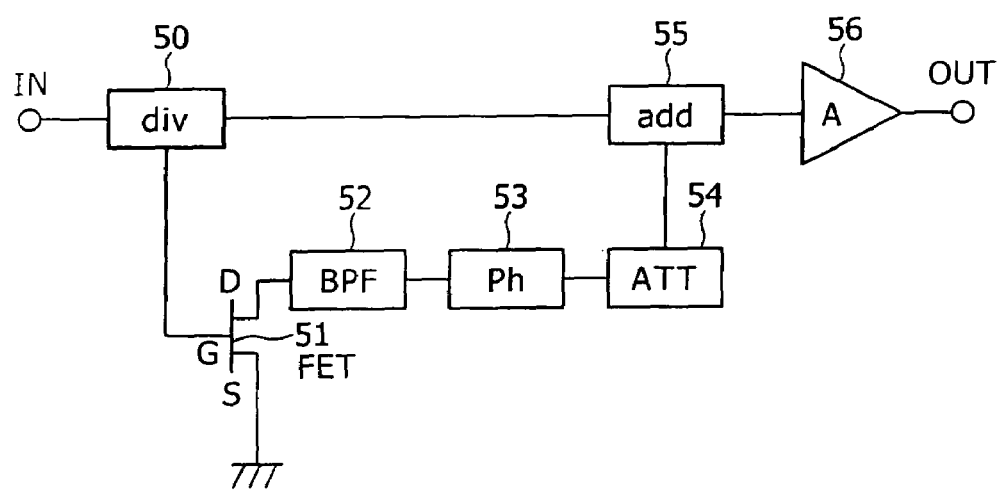
FIG. 13 shows a prior art for improving distortion by injecting a second harmonic.

The following describes operations of the distortion compensating and power amplifying apparatus in FIG. 1. Like the apparatus as shown in FIG. 13, the branch circuit 10 in FIG. 1 branches an input signal into two signals. One branched signal passes through the first matching circuit 11 and then is input to the source-grounded FET 12. The FET 12 used for the embodiment is a small-sized one having the gate width of approximately 200 μm. The band pass filter 13 extracts a second harmonic generated in the FET 12. The attenuation circuit 14 and the phase circuit 15 adjust the second harmonic's amplitude and phase. The second harmonic is input to the first input terminal of the addition circuit 16. On the other hand, the other output of the branch circuit 10 is input to the second input terminal of the addition circuit 16. An added output is input to the power amplifying FET.

Figure 2A:
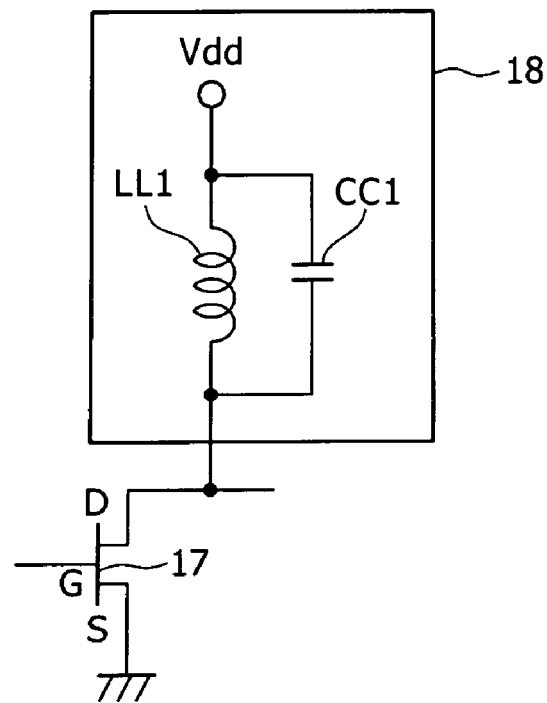
FIG. 2 shows two construction examples of a second harmonic termination circuit.
Figure 2B:
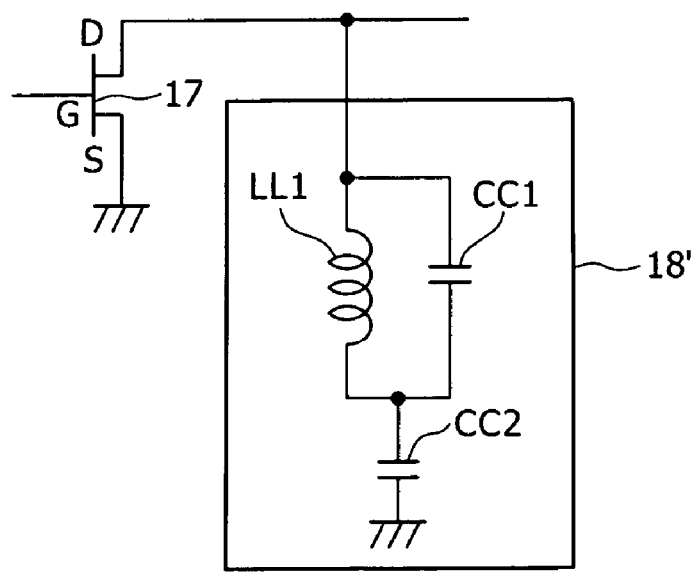
Figure 5:
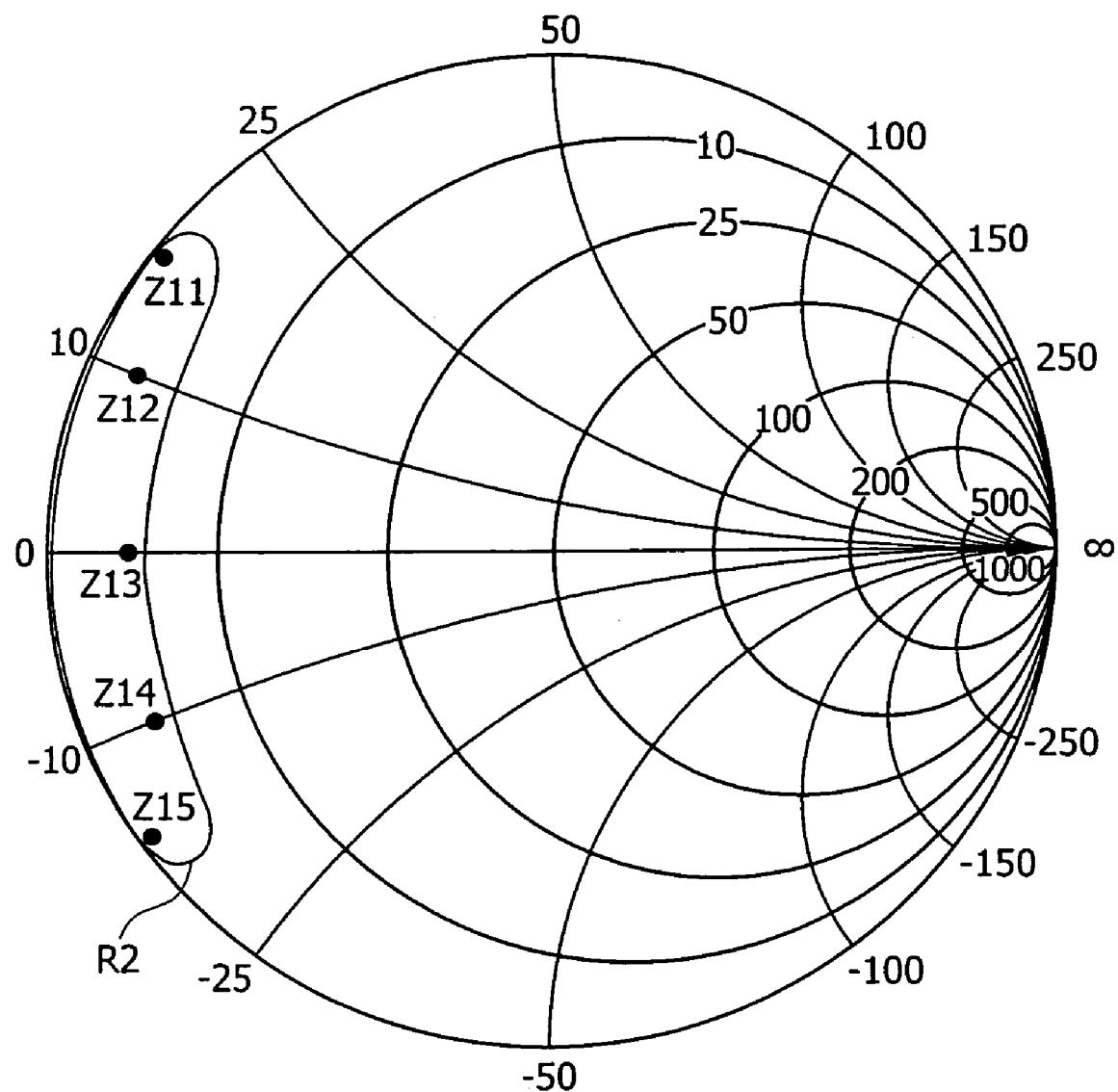
FIG. 5 shows an impedance region R2 containing preferable impedances Z11 through Z15 against a fundamental wave a second harmonic termination circuit.

FIGS. 2A and 2B show two construction examples of the second harmonic termination circuit. A second harmonic termination circuit 18 in FIG. 2A uses a coil LL1 and a capacitor CC1 parallel connected to each other. The circuit is configured to a value resonant with a fundamental wave (e.g., 900 MHz). Consequently, the second harmonic termination circuit 18 is assumed to be almost infinite impedance (open) against the fundamental wave. FIG. 5 shows an impedance region R2 containing preferable impedances Z11 through Z15. On the other hand, the function of the capacitor CC1 allows the second harmonic termination circuit 18 to function as a short circuit against a second harmonic (1.8 GHz based on the 900 MHz fundamental wave). FIG. 2A shows that the second harmonic termination circuit is provided at the power supply voltage side. FIG. 2B shows that a second harmonic termination circuit 18' is provided at the ground side. The second harmonic termination circuit 18' serially inserts a capacitor CC2 having a relatively large capacity between the ground and a parallel connection of the coil LL1 and the capacitor CC1. This prevents the drain terminal of the FET 17 from being grounded in the manner of direct current. The second harmonic termination circuit in FIG. 2B has the same function as that in FIG. 2A.

The following describes how distortion of the power amplifying FET 17 is compensated. In the following description, third-order intermodulation distortion (IM3) is considered as distortion to be compensated. When a second harmonic is injected, equation (1) below is used to describe the IM3 wave's voltage display. An input signal is assumed to include a 2-tone wave having angular frequencies $\omega 1$ and $\omega 2$. Only the upper IM3 is observed for simplicity. Throughout the measurement, we found no significant difference between the upper and lower IM3 levels.

$$Vim3(2\omega 2-\omega 1)=H3(\omega 2,-\omega 1,\omega 2)\cdot Vs^3+H3(2\omega 2,-2\omega 1, \omega 1)Vs\cdot V2d^2+H2(2\omega 2,-\omega 1)\cdot Vs\cdot V2d \quad (1)$$

Variables in equation (1) has the following meanings.

$\omega 1$, $\omega 2$: Angular frequencies ($\omega 1<\omega 2$) of the 2-tone input wave $2\omega 2-\omega 1$: Angular frequency component in the upper IM3

$H2(*,*)$: Fourier transform of a second order Volterra kernel for FET 01

$H3(*,*,*)$: Fourier transform of a third order Volterra kernel for FET 01

Vs: Composite voltage of the input 2-tone wave

V2d: Complex voltage of the injected second harmonic

In equation (1), the first term of the right side is the IM3 voltage display when no second harmonic injection is available. The second and third terms concern the second harmonic injection. When the second harmonic injection performs the distortion compensation, this simply means that there is available second harmonic V2d satisfying equation (1) =0. Therefore, when there is not available V2d that satisfies equation (1)=0, it is impossible to provide the effect of the distortion compensation according to the harmonic injection. The following equation (2) is a condition for existence of such solution V2d, assuming equation (1) to be a quadratic expression of V2d.

$$H2(2\omega 2,-\omega 1)\cdot Vs]^{2-4}\cdot [H3(\omega 2,-\omega 1,\omega 2)Vs]\cdot [H3 (2\omega 2,-2\omega 1,\omega 1)\cdot Vs^3]>0 \quad (2)$$

Since H(*) is a complex number, equation (2) needs to hold true for both the real part and the imaginary part.

Figure 3:
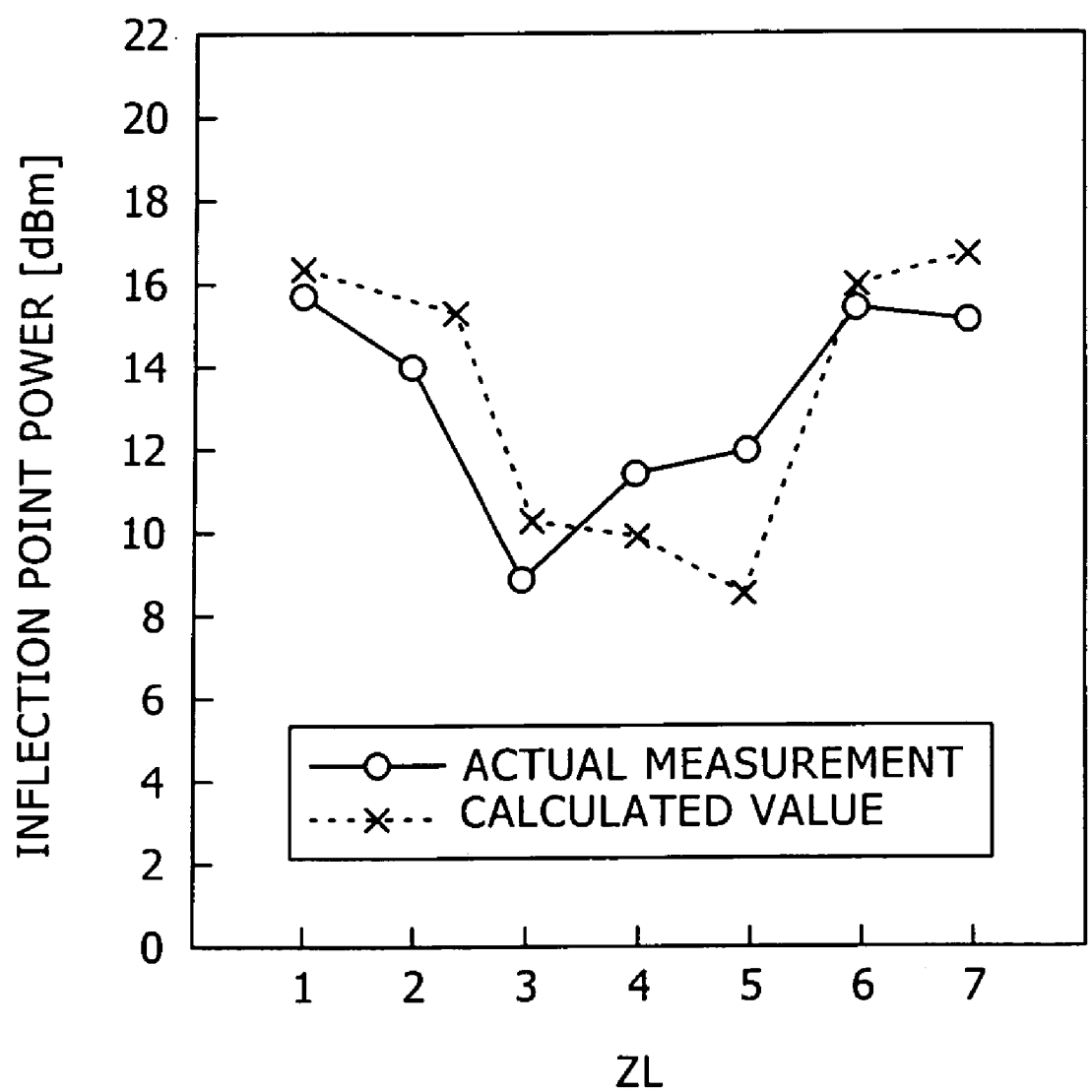
FIG. 3 is a graph showing actual measurements and calculated values for the inflection point power (Pout=10 dBm in FIG. 6) found in "related example" of FIG. 6 when a second harmonic is injected (no second harmonic termination circuit provided) to perform distortion compensation for seven impedance points in FIG. 4.
Figure 4:
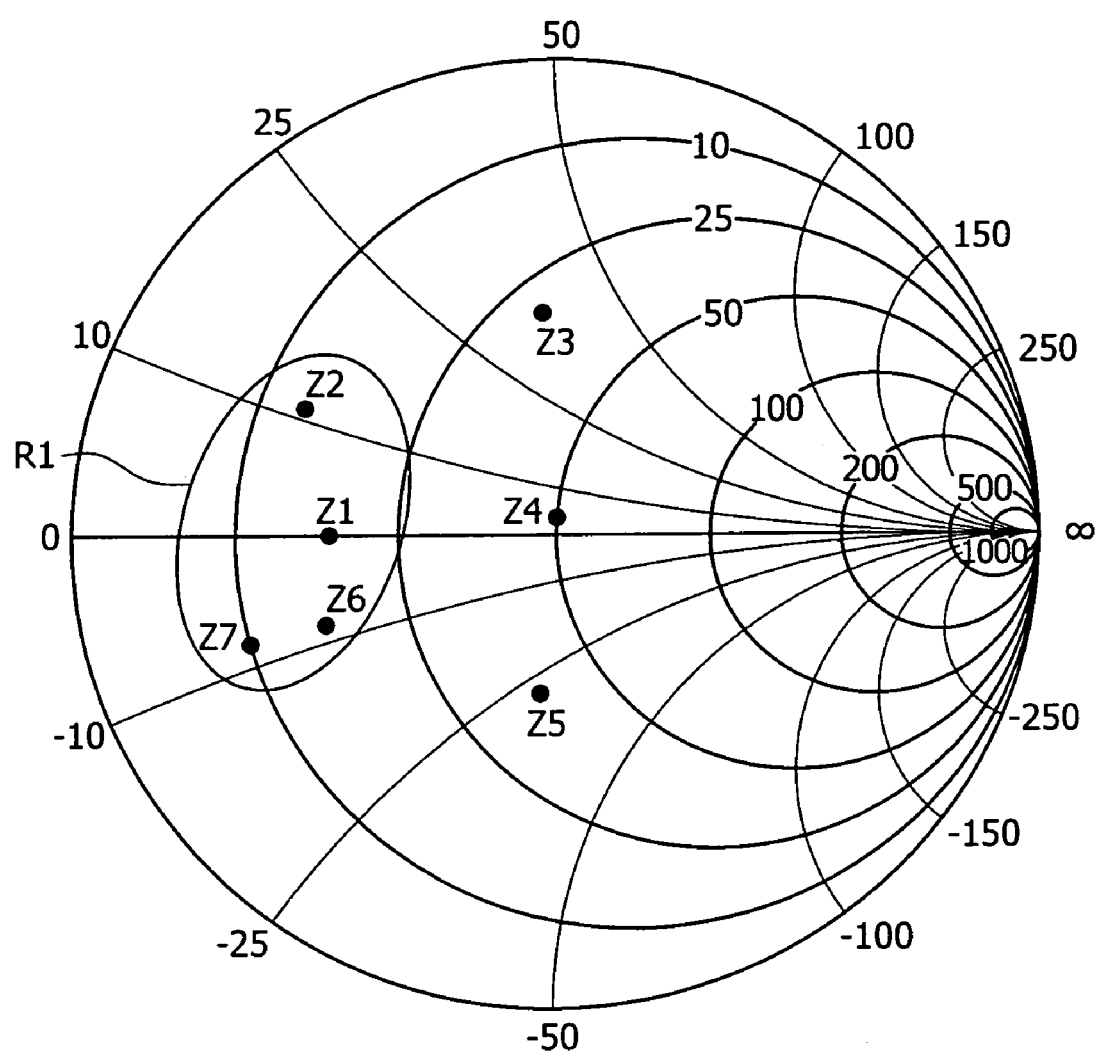
FIG. 4 is a Smith chart showing load points used for the analysis in FIG. 3.
Figure 6:
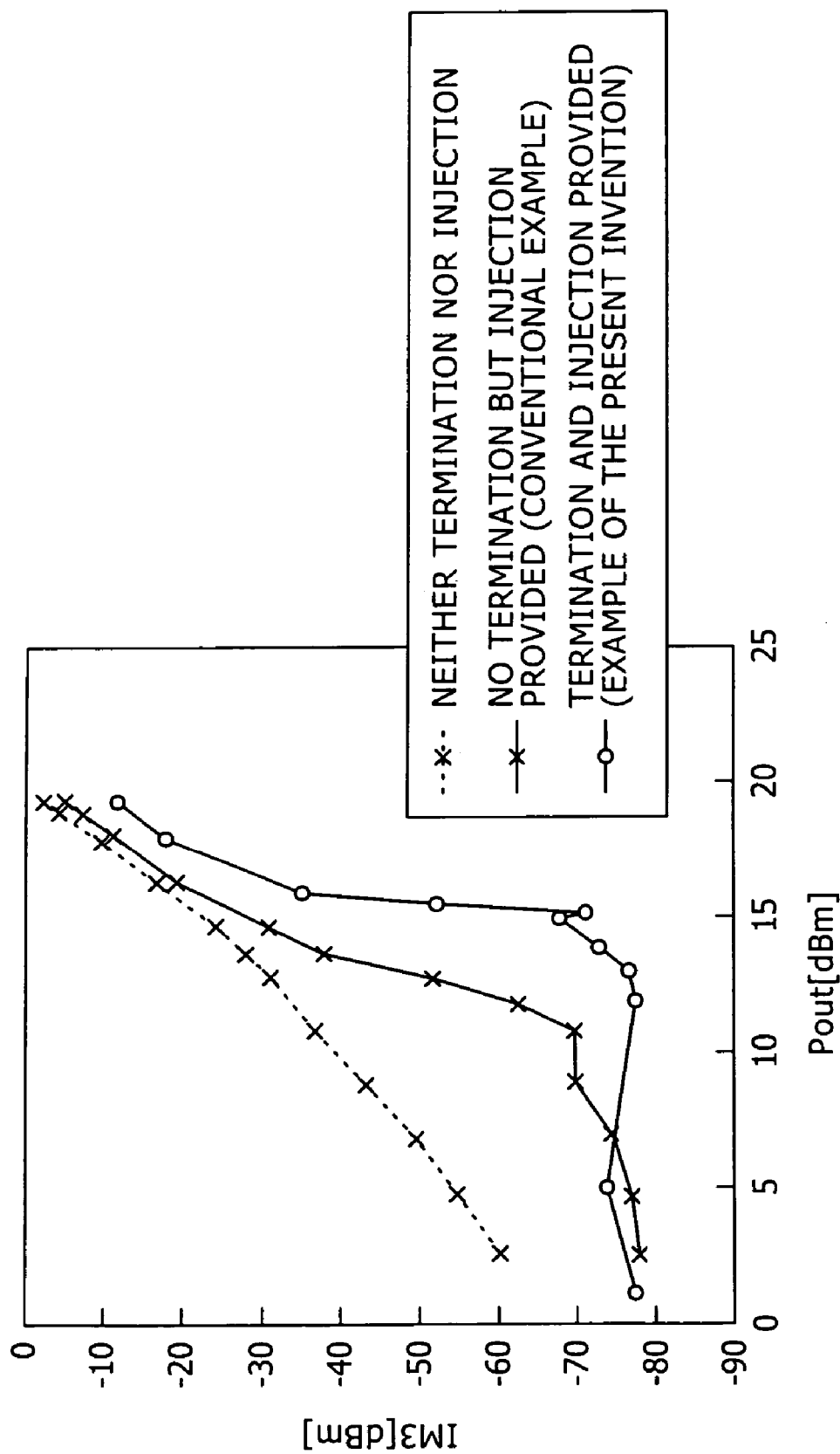
FIG. 6 is a graph showing output dependency of the third-order intermodulation distortion (IM3)

FIG. 3 shows actual measurements and calculated values according to equation (1) for the inflection point power (Pout =10 dBm in FIG. 6) found in "related example" of FIG. 6 when a second harmonic is injected (no second harmonic termination circuit provided) to perform distortion compensation for seven impedance points in FIG. 4. The specification uses the term "inflection point power" to represent a Pout value that suddenly increases the IM3 value as shown in the graph of FIG. 6. The impedances at seven points in FIG. 4 correspond to impedances of the matching circuit Mout viewed from its drain. The results of FIG. 3 show high inflection point power for the impedance region containing impedances Z1, Z2, Z6, and Z7. For actual measurement, we used an HEMT (High-Electron-Mobility Transistor) with Wg=14 mm. We extracted nonlinear parameters for the HEMT and used them for calculation of equation (1). The results of FIG. 3 can provide confirmation of good correspondence between the calculation and the actual measurement. It is possible to understand that the above-mentioned hypothesis is almost correct.

Figure 7:
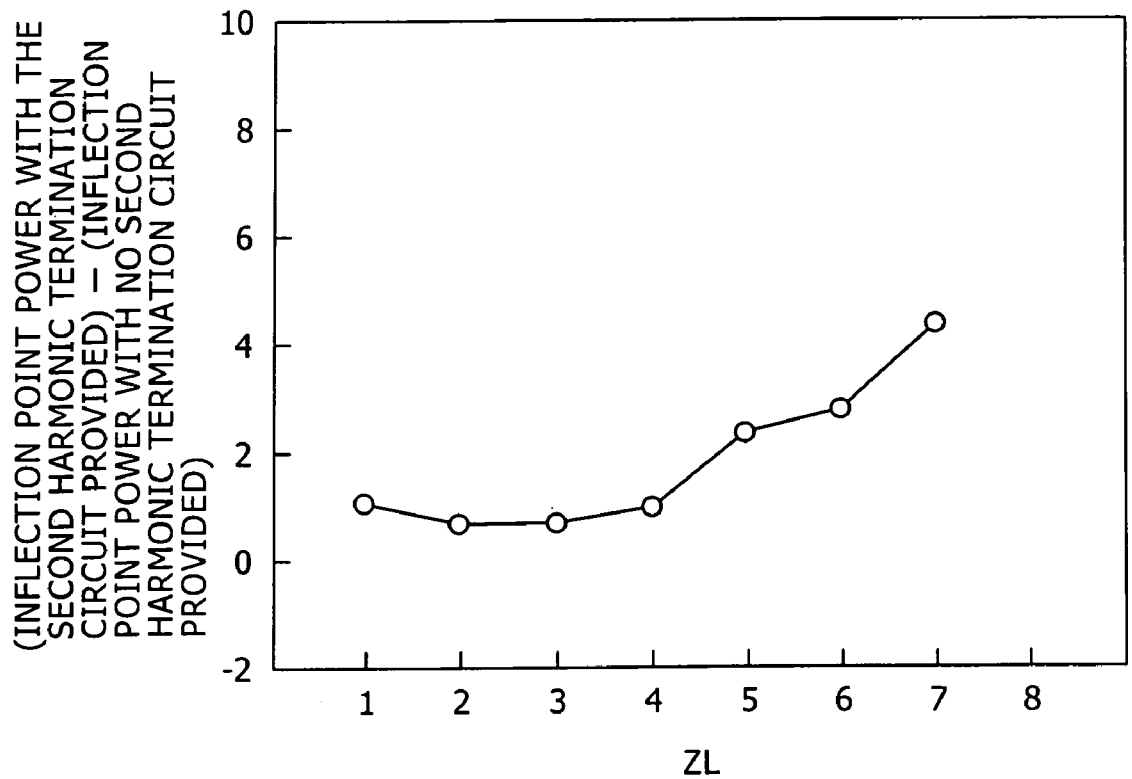
FIG. 7 is a graph showing actual measurements for load dependence of an increase in the inflection point power depending on the presence or absence of a second harmonic termination circuit.

It is preferable for the distortion compensation that Pout takes effect up to as large a value as possible. According to the present invention, the drain terminal of FET01 is provided with the second harmonic termination circuit to increase the inflection point power. Equation (1) takes effect for analysis when the second harmonic termination circuit is provided. FIG. 7 shows actual measurements for load dependence of an increase in the inflection point power depending on the presence or absence of a second harmonic termination circuit. The ordinate of the graph indicates a value found by subtracting the inflection point power with no second harmonic termination circuit provided from the inflection point power with the second harmonic termination circuit provided. FIG. 7 makes it clear that the inflection point power with the second harmonic termination circuit provided generally increases (positive sign for differences). The inflection point power remarkably rises at impedances Z6 and Z7. "Example of the present invention" in FIG. 6 shows results obtained by sweeping input power at load point Z7 and makes the following clear. The inflection point power increases (shifted to the right along the abscissa in FIG. 6) more than "related example" with no second harmonic termination circuit provided. IM3 is accordingly improved also in a large output area.

Figure 8:
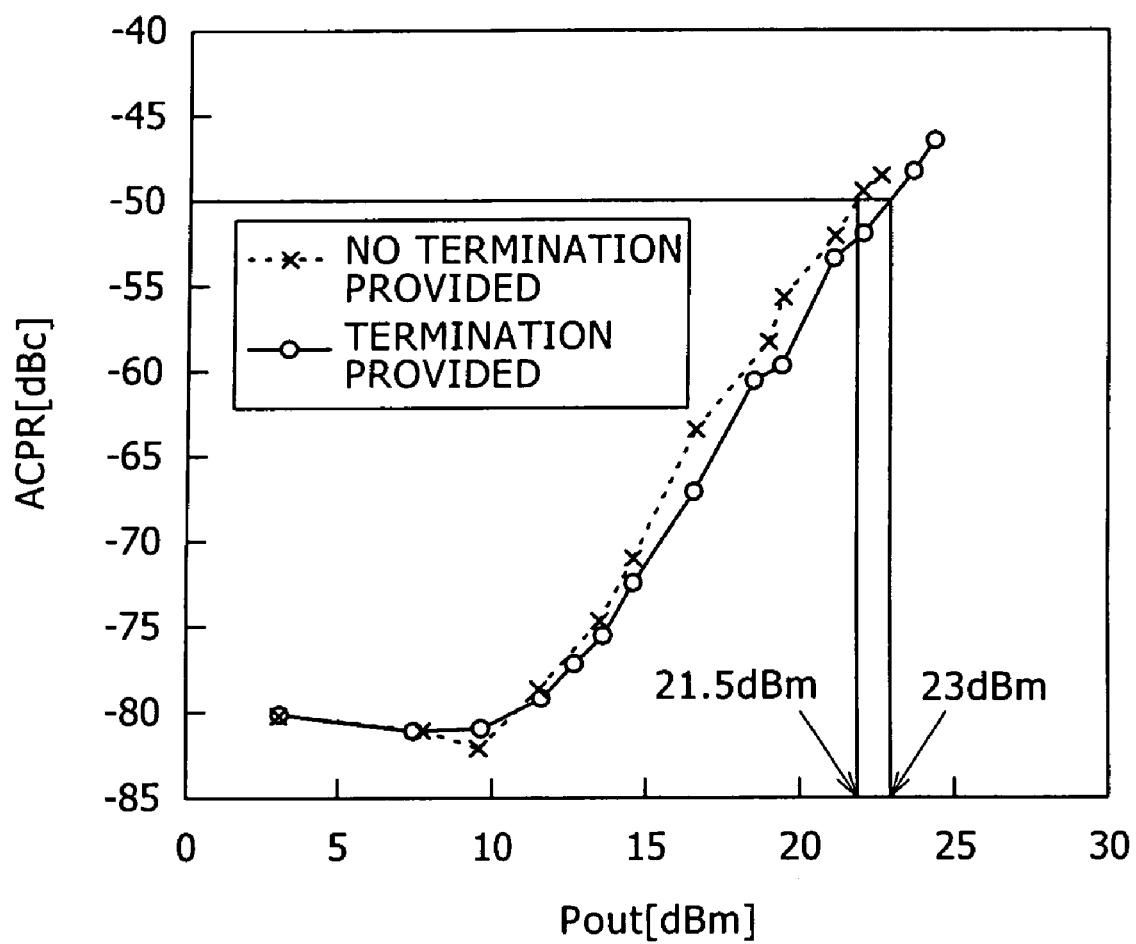
FIG. 8 is a graph showing relationship between output and an adjacent channel power ratio when an OQPSK signal is used as input signal.

FIG. 8 is a graph showing relationship between output and an adjacent channel power ratio when an OQPSK signal is used as input signal. The OQPSK signal is defined in audio signals compliant with CDMA2000. Two graphs represent cases where the second harmonic termination circuit 18 according to the embodiment is provided and not. The adjacent channel power ratio is specified at a 900 kHz detuning point and is sampled at the −50 dBc point for examination. That is, the adjacent channel power ratio represents a power ration at the 900 kHz detuning point based on the transmission power and the band center and provides a distortion amount standardized by IS95B. According to the embodiment, a design target is ACPR <−50 dBc. As seen from the graphs in FIG. 8, the related example shows Pout=21.5 dBm. On the other hand, the embodiment according to the present invention shows Pout=23 dBm, improving output by 1.5 dB.

The following describes how the second harmonic injection increases the inflection point power when the second harmonic termination circuit is provided. Equation (3) below formulates Vs satisfying equation (2)=0, i.e., an input signal supplying the inflection point power.

$$Vs=[H2(2\omega2,-\omega1)]^2/4 \cdot [H3(\omega2,-\omega1,\omega2)] \cdot [H3\ (2\omega2,-2\omega1,\omega1)]>0 \quad (3)$$

There may be the following two reasons why the second harmonic termination circuit increases Vs given by equation (3).

First reason: Mounting the second harmonic termination circuit decreases the feedback amount of a drain-gate capacity (Cdg) structurally intrinsic to FET01. This means that the gain decreases due to a decrease in the equivalent Cdg value connected between the gate and the earth. As a result, H2(*) increases. Consequently, Vs given by equation (2) increases.

Second reason: Mounting the second harmonic termination circuit decreases $H3\ (\omega2,-\omega1,\omega2)$ in the denominator of equation (3). This term represents IM3 of the FET 17. When the second harmonic termination circuit 18 is mounted to decrease IM3, the inflection point power may also increase.

Patent documents 1 and 2 disclose the constructions that connect a circuit for short-circuiting the second harmonic to an output terminal of the source-grounded FET constituting the high-frequency power amplifying circuit. These constructions aim at improving the power efficiency. They do not imply application of such termination circuit to the circuit as shown in FIG. 13 for implementing distortion compensation using the harmonic injection. The inventors found that the inflection point power increases by applying such termination circuit to the circuit as shown in FIG. 13 for implementing distortion compensation using the harmonic injection.

Figure 9:
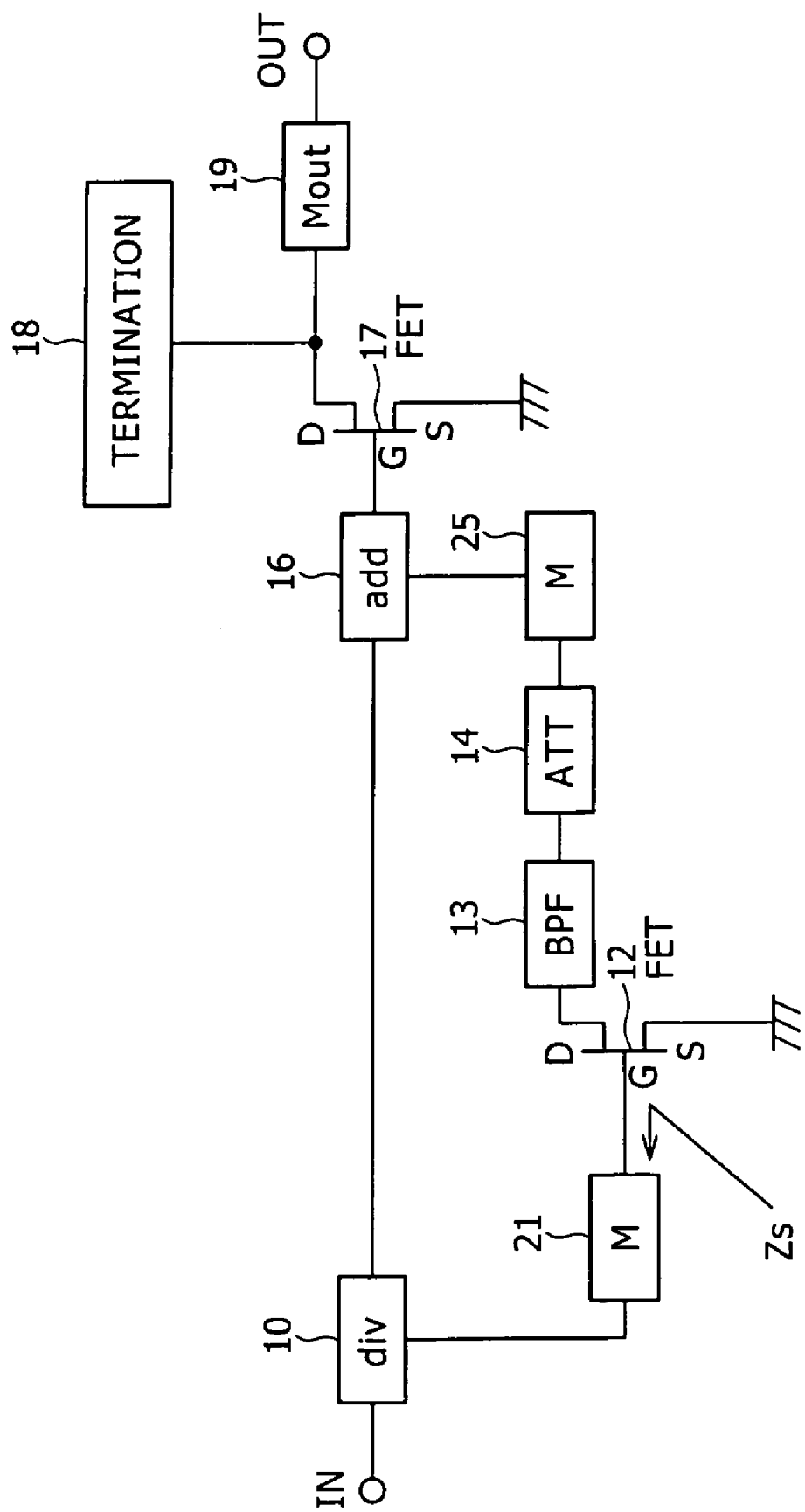
FIG. 9 is a block diagram showing a second embodiment of the present invention.

FIG. 9 is a block diagram showing a second embodiment of the present invention. The mutually corresponding parts in FIGS. 9 and 1 are designated by the same reference numerals. There are following differences from the apparatus in FIG. 1. The phase circuit 15 in FIG. 1 is removed and a matching circuit 25 is inserted instead. The matching circuit 11 preceding the FET 12 is changed to a matching circuit 21. The inventors already proposed such construction in JP-B No. 32351/2004.

Operations of the apparatus in FIG. 9 are described below. When an input signal is input to an input terminal IN, the branch circuit 10 branches the input signal into two signals. One of the branched signals passes through the matching circuit 21 and is input to the source-grounded FET 12. The band pass filter 13 extracts a second harmonic generated in the FET 12. The attenuation circuit 14 adjusts the second harmonic's amplitude. The signal passes through the second matching circuit 25 and is input to a first input terminal of the addition circuit 16. The second matching circuit 25 provides matching so that the second harmonic output from the attenuation circuit 14 is efficiently input to the power amplifier 17 without reflection via the addition circuit 16. On the other hand, the other of the branched signals is input to a second input terminal of the addition circuit 16. The added output is input to the power amplifying FET 18.

As described in non-patent document 5, distortion components generated from the FET 12 depend on impedance Zs connected to the gate of the FET 12. Impedance Zs connected to the gate influences the phase and the amplitude of distortion generated from the FET 12. Since the second harmonic is a distortion component, the property described in non-patent document 5 is considered to be effective for the second harmonic. Accordingly, adjusting impedance Zs can make the phase of the second harmonic to be generated a value necessary for distortion compensation of the power amplifying FET 17. In particular, adjusting a value of the matching circuit 21 provides the second harmonic generated from the FET 12 with rotation of a phase equivalent to that rotated by the phase circuit 15 in FIG. 1. This can eliminate the need for the phase circuit 15. Generally, a lumped constant circuit can be used to implement the matching circuit 21. The circuit scale can be much smaller than the phase circuit 15. The constitution and effects of the second harmonic termination circuit 18 are the same as those of the apparatus in FIG. 1.

Figure 10A:
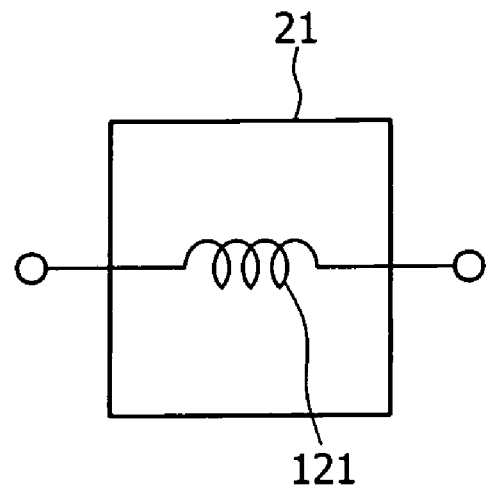
FIGS. 10A and 10B are circuit diagrams showing specific construction examples of matching circuits 21 and 25.
Figure 10B:
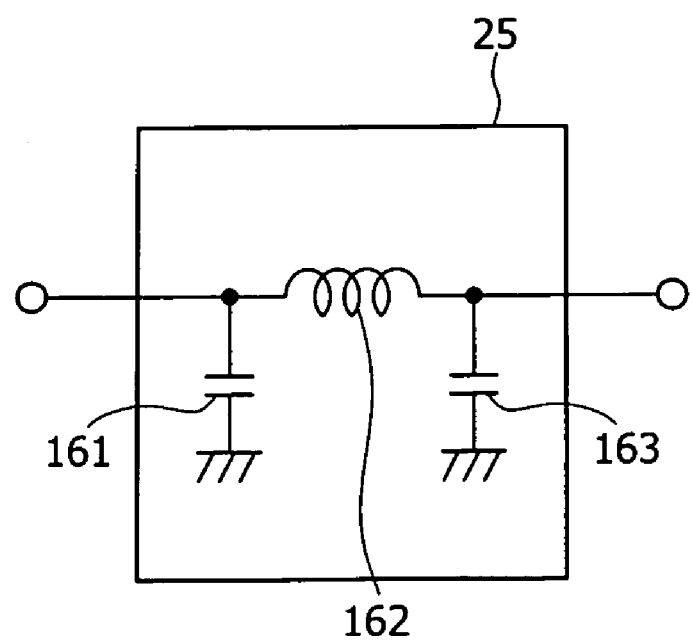

FIGS. 10A and 10B show specific construction examples of the matching circuits 21 and 25. In the examples, the matching circuit 21 includes a coil (inductor) 121. The matching circuit 25 includes a π-type circuit containing condensers (capacitors) 161 and 163 and a coil 162. The constructions of the matching circuits 21 and 25 according to the present invention are not limited those shown in FIGS. 10A and 10B. The object of the matching circuit 11 in FIG. 1 is to prevent reflection of signals between the branch circuit 10 and the FET 12, not to adjust second harmonic phases as intended in the present invention.

Figure 11:
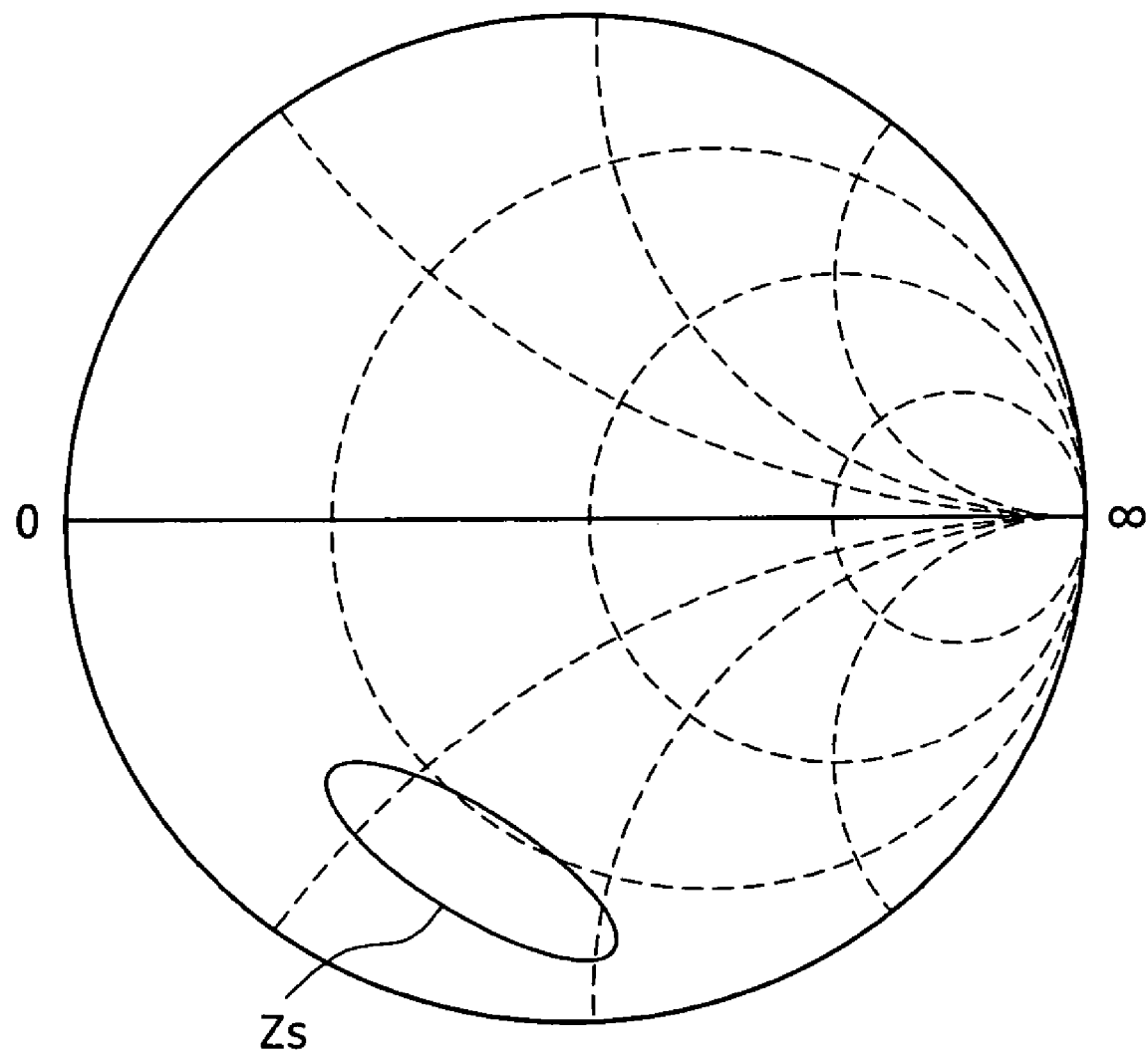
FIG. 11 is a Smith chart showing a range of impedance Zs connected to the FET gate according to the embodiment of FIG. 9.

FIG. 11 is a Smith chart showing an appropriate range of impedance Zs connected to the gate of the FET 12 according to the embodiment of FIG. 9. The embodiment succeeded in effective distortion compensation so that Zs was designed to fit in the range as shown in FIG. 11.

Figure 12:
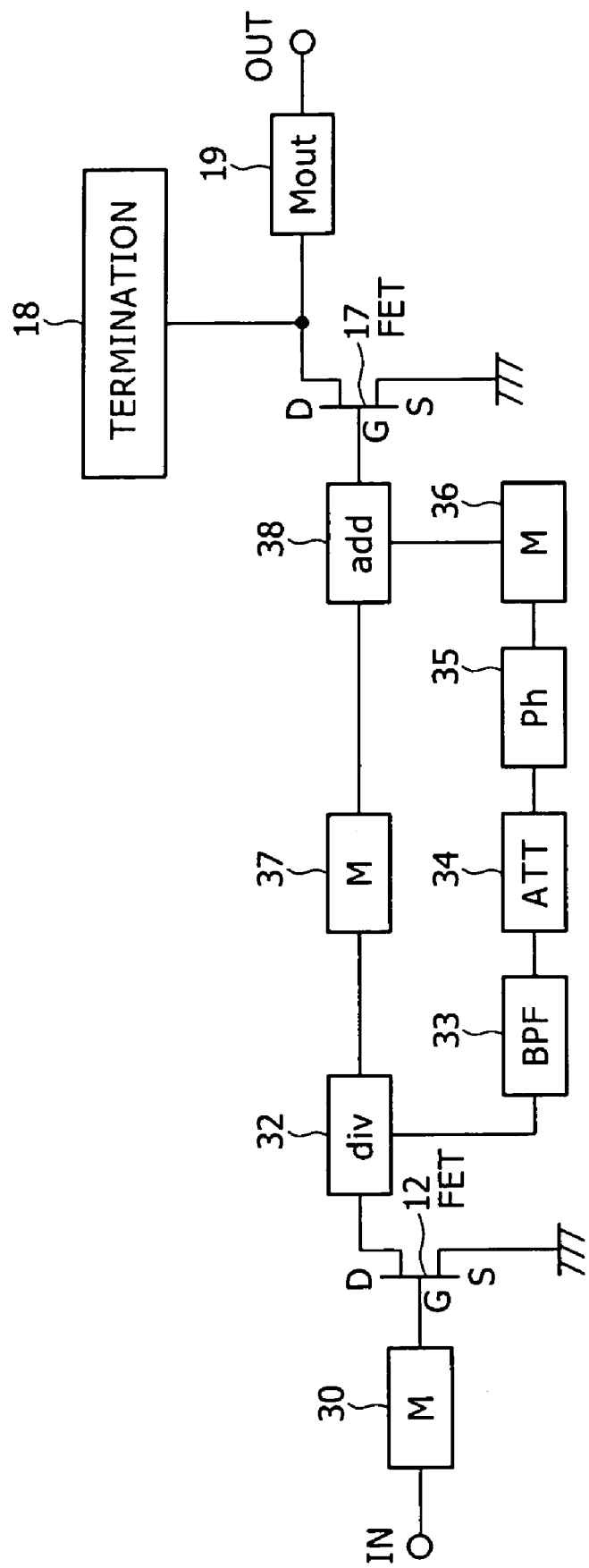
FIG. 12 is a block diagram showing a third embodiment of the present invention.

FIG. 12 is a block diagram showing a third embodiment of the present invention. The mutually corresponding parts in FIG. 12 and the above-mentioned embodiments are designated by the same reference numerals.

The power amplifying apparatus includes two stages of amplifiers, i.e., a first source-grounded FET 12 and a second source-grounded FET 39 directly connected to each other. The amplifying apparatus further includes a first matching circuit 30, a branch circuit 32, a second matching circuit 37, a band pass filter 33, an attenuation circuit 34, a phase circuit 35, a third matching circuit 36, an addition circuit 38, a second harmonic termination circuit 18, and a matching circuit 19. The first matching circuit 30 is connected between an input terminal IN and the gate of the first FET 12. The branch circuit 32 is connected to a drain terminal of the source-grounded FET 12 to branch drain output into two signals. The second matching circuit 37 is connected between a second output terminal of the branch circuit 32 and the addition circuit 38 to be described later. The band pass filter 33 is connected to a first output terminal of the branch circuit 32 and passes only second harmonics. The attenuation circuit 34 is connected to output from the band pass filter 33 and attenuates second harmonic signal voltages. The phase circuit 35 is connected to output from the attenuation circuit 34 and adjusts second harmonic phases. The third matching circuit 36 is supplied without put from the phase circuit 35. The addition circuit 38 adds both outputs from the matching circuits 36 and 37. The second harmonic termination circuit 18 grounds a second harmonic. The matching circuit 19 provides a match between a drain terminal of the FET 17 and an output terminal OUT. The addition circuit 38 connects its first input terminal with output from the third matching circuit 36 and its second input terminal with output from the second matching circuit 37. The addition circuit 38 adds inputs signals to the first and second input terminals to each other. Output from the addition circuit 38 is input to a gate terminal of the power amplifying FET 17. A drain terminal of the FET 17 is connected to the second harmonic termination circuit 18 and to the fourth matching circuit 19. An output terminal of the fourth matching circuit 19 is used as an output terminal OUT of the amplifying apparatus.

The following describes operations of the third embodiment. The first matching circuit 30 and the FET 12 and the second matching circuit 37 and the FET 17 chiefly constitute the 2-stage power amplifier. The branch circuit 32, the band pass filter 33, the attenuation circuit 34, and the third matching circuit 36 operate the same as the first embodiment. According to the third embodiment, the FET 12 provides two functions: an initial amplification section of the main power amplifier and a second harmonic generator to suppress distortion generated in the final FET of the main amplifier. Distortion components generated in the FET 12 contribute to distortion generated in the main amplifier. The amount of the distortion is negligible compared to distortion generated in the FET 17. Accordingly, suppressing the distortion generated in FET 17 is fully effective. The construction and effects of the second harmonic termination circuit 18 are similar to those of the apparatus in FIG. 1.

The construction in FIG. 9 can be applied to remove the phase circuit 35 from the embodiment in FIG. 12.

While there have been described specific preferred embodiments of the present invention, it is to be distinctly understood that various changes and modifications may be otherwise made in the present invention. For example, the FET may be replaced by a bipolar transistor in the constructions of the above-mentioned embodiments. In this case, the FET's drain, source, and gate terminals correspond to the bipolar transistor's collector, emitter, and base terminals, respectively.

It should be understood by those skilled in the art that various modifications, combinations, sub-combinations and alterations may occur depending on design requirements and other factors insofar as they are within the scope of the appended claims or the equivalents thereof.

What is claimed is:

1. A distortion compensating and power amplifying apparatus comprising:
   a transistor for power amplifying an input signal;
   a branch circuit for branching the input signal into two signals;
   distortion compensation means for generating a second harmonic of a fundamental wave for one of branched signals, adding the generated second harmonic to the other branch signal from said branch circuit, and inputting to an input terminal of said transistor; and
   a termination circuit connected to an output terminal of said transistor, said termination circuit for grounding the second harmonic, and
   wherein said termination circuit includes a coil and a capacitor connected parallel to each other, and
   wherein said termination circuit is configured so that said transistor's output terminal functions substantially as an open circuit against the fundamental wave and functions substantially as a short-circuit against the second harmonic.

2. The distortion compensating and power amplifying apparatus according to claim 1,
   wherein said parallel connected coil and capacitor constitute a parallel resonance circuit which is connected between said transistor's output terminal and a power supply.

3. The distortion compensating and power amplifying apparatus according to claim 1,
   wherein said parallel connected coil and capacitor constitute a parallel resonance circuit whose one end is connected to said transistor's output terminal.

4. The distortion compensating and power amplifying apparatus according to claim 1, wherein said transistor is a source-grounded FET whose gate terminal constitutes said transistor's input terminal and whose drain terminal constitutes said transistor's output terminal.

5. The distortion compensating and power amplifying apparatus according to claim 1, wherein
said distortion compensation means comprises:
a source-grounded FET whose gate terminal receives one of said branched signals;
a band pass filter for passing only a second harmonic connected to the FET's drain terminal;
an attenuation circuit connected to said band pass filter's output, said attenuation circuit for attenuating a second harmonic's signal voltage;
a phase circuit connected to said attenuation circuit's output, said phase circuit for adjusting the second harmonic's phase; and
an addition circuit for adding said phase circuit's output to the other branch signal from said branch circuit.

6. The distortion compensating and power amplifying apparatus according to claim 1, wherein
said distortion compensation means comprises:
a source-grounded FET whose gate terminal receives one of said branched signals;
a matching circuit connected between said branch circuit and said source-grounded FET's gate terminal, said matching circuit having a specified impedance;
a band pass filter connected to said source-grounded FET's drain terminal, said band pass filter for passing only the input signal's second harmonic;
an attenuation circuit connected to this band pass filter's output, said attenuation circuit for attenuating a second harmonic's signal voltage; and
an addition circuit for adding said attenuation circuit's output to the other branch signal from said branch circuit, and
wherein said matching circuit's specified impedance affects phases of the second harmonic generated from said transistor and is configured so that a second harmonic input to said addition circuit compensates distortion generated in said power amplifying apparatus.

7. A distortion compensating and power amplifying apparatus comprising:
a matching circuit configured to receive an input signal, said matching circuit including a specified impedance;
a first source-grounded FET whose gate terminal receives said matching circuit's output;
a branch circuit configured to branch a signal output from said first source-grounded FET's drain terminal into two branch signals;
a transistor configured to power amplify an input signal;
distortion compensation means for extracting a fundamental wave's second harmonic contained in one of the two branch signals, adding the second harmonic to the other of the two branch signals from said branch circuit, and adding a result to said transistor's input terminal; and
a termination circuit connected to an output terminal of said transistor, said termination circuit configured to ground the second harmonic.

8. The distortion compensating and power amplifying apparatus according to claim 7,
wherein said termination circuit includes a coil and a capacitor connected parallel to each other and,
wherein said termination circuit is configured so that said transistor's output terminal functions substantially as an open circuit against the fundamental wave and functions substantially as a short-circuit against the second harmonic.

9. The distortion compensating and power amplifying apparatus according to claim 8,
wherein said parallel connected coil and capacitor comprise a parallel resonance circuit which is connected between said transistor's output terminal and a power supply.

10. The distortion compensating and power amplifying apparatus according to claim 8,
wherein said parallel connected coil and capacitor comprise a parallel resonance circuit whose one end is connected to said transistor's output terminal.

11. The distortion compensating and power amplifying apparatus according to claim 8,
wherein said transistor is a second source-grounded FET whose gate terminal includes said transistor's input terminal and whose drain terminal includes said transistor's output terminal.

12. The distortion compensating and power amplifying apparatus according to claim 11, wherein
said distortion compensation means comprises:
a band pass filter for passing only the second harmonic;
an attenuation circuit connected to said band pass filter's output, said attenuation circuit for attenuating a second harmonic's signal voltage;
a phase circuit connected to said attenuation circuit's output, said phase circuit for adjusting the second harmonic's phase; and
an addition circuit for adding the phase circuit's output to the other branch signal from said branch circuit.

13. The distortion compensating and power amplifying apparatus according to claim 11, wherein
said distortion compensation means comprises:
a band pass filter connected to said first source-grounded FET's drain terminal, said band pass filter configured to pass only the input signal's second harmonic;
an attenuation circuit connected to said band pass filter's output, said attenuation circuit configured to attenuate a second harmonic's signal voltage; and
an addition circuit configured to add said attenuation circuit's output to the other branch signal from said branch circuit, and
wherein said matching circuit's specified impedance affects phases of the second harmonic generated from said second source-grounded FET and is configured so that a second harmonic input to said addition circuit compensates distortion generated in said power amplifying apparatus.

* * * * *

UNITED STATES PATENT AND TRADEMARK OFFICE
CERTIFICATE OF CORRECTION

PATENT NO. : 7,307,473 B2 Page 1 of 1
APPLICATION NO. : 11/108666
DATED : December 11, 2007
INVENTOR(S) : Shigeo Kusunoki et al.

It is certified that error appears in the above-identified patent and that said Letters Patent is hereby corrected as shown below:

Column 6, line 66, change "$Vs]^{2-4}$" to -- $Vs]^2-4$ --

Signed and Sealed this

Eighth Day of July, 2008

JON W. DUDAS
*Director of the United States Patent and Trademark Office*